(12) United States Patent
Koestler et al.

(10) Patent No.: US 10,254,367 B2
(45) Date of Patent: Apr. 9, 2019

(54) MAGNETIC RESONANCE IMAGING METHOD AND APPARATUS WITH MOTION-CORRECTED MODEL-BASED ACCELERATION OF PARAMETER MAPPING

(71) Applicant: Siemens Healthcare GmbH, Erlangen (DE)

(72) Inventors: Herbert Koestler, Retzbach (DE); Felix Ruetzel, Greussenheim (DE); Johannes Tran-Gia, Wuerzburg (DE); Tobias Wech, Wuerzburg (DE)

(73) Assignee: Siemens Healthcare GmbH, Erlangen (DE)

( * ) Notice: Subject to any disclaimer, the term of this patent is extended or adjusted under 35 U.S.C. 154(b) by 202 days.

(21) Appl. No.: 15/299,654

(22) Filed: Oct. 21, 2016

(65) Prior Publication Data

US 2017/0115367 A1    Apr. 27, 2017

Related U.S. Application Data

(60) Provisional application No. 62/245,488, filed on Oct. 23, 2015.

(51) Int. Cl.
*G01R 33/50*    (2006.01)
*G01R 33/56*    (2006.01)
(Continued)

(52) U.S. Cl.
CPC ......... *G01R 33/5601* (2013.01); *G01R 33/50* (2013.01); *G01R 33/56509* (2013.01); *G01R 33/56325* (2013.01)

(58) Field of Classification Search
CPC ................ G01R 33/5601; G01R 33/50; G01R 33/56509; G01R 33/56325
See application file for complete search history.

(56) References Cited

U.S. PATENT DOCUMENTS

| | | | |
|---|---|---|---|
| 6,368,574 B1 * | 4/2002 | Akeson ............. | G01R 33/5601 424/9.1 |
| 2006/0018548 A1 * | 1/2006 | Chen ..................... | G06T 7/0012 382/190 |

(Continued)

OTHER PUBLICATIONS

Stalder et al.: "Cardiac Multi-Contrast CINE: Real-Time Inversion-Recovery Balanced Steady-State Free Precession Imaging with Compressed-Sensing and Motion-Propagation", ISMRM, vol. 5667, p. 1, (2014).

(Continued)

*Primary Examiner* — Rodney A Bonnette
(74) *Attorney, Agent, or Firm* — Schiff Hardin LLP

(57) ABSTRACT

In a magnetic resonance (MR) method and apparatus, an image reconstruction algorithm is used to reconstruct image data from k-space data that represent an acquired MR signal, and the reconstruction algorithm makes use of a model that requires the MR signal to exhibit a signal behavior from a relaxation model. In order to permit the reconstruction algorithm to be used when the acquired MR signal does not exhibit the model signal behavior due to motion of the subject, the k-space data are motion-corrected so as to produce corrected k-space data that represent said model signal behavior, and image data are reconstructed from the corrected k-space data using the reconstruction algorithm.

12 Claims, 4 Drawing Sheets

(51) Int. Cl.
*G01R 33/565* (2006.01)
*G01R 33/563* (2006.01)

(56) References Cited

U.S. PATENT DOCUMENTS

2011/0260725 A1* 10/2011 Mordini ........... G01R 33/56325
　　　　　　　　　　　　　　　　　　　324/309
2012/0243756 A1* 9/2012 Samsonov ....... G01R 33/56509
　　　　　　　　　　　　　　　　　　　382/131

OTHER PUBLICATIONS

Kim et al; The Use of Contrast-Enhanced Magnetic Resonance Imaging to Identify Reversible Myocardial Dysfunction, The New England Journal of Medicine, Nov. 16, 2000, pp. 1445-1458 (2000).
Beck et al.: "A Fast Iterative Shrinkage-Thresholding Algorithm for Linear Inverse Problems"; SIAM J. Imaging Sciences, vol. 2, No. 1, pp. 183-202; (2009).
Myronenko,et. al.: "Intensity-Based Image Registration by Minimizing Residual Complexity",: IEEE Transactions on Medical Imaging, vol. 29, No. 11, pp. 1882-1891; (2010).
Tran-Gia, et. al.: "Model-Based Acceleration of Parameter Mapping (MAP) for Saturation Prepared Radially Acquired Data", Magnetic Resonance in Medicine, vol. 70, pp. 1524-1534 (2013).

\* cited by examiner

MAGNETIC RESONANCE IMAGING METHOD AND APPARATUS WITH MOTION-CORRECTED MODEL-BASED ACCELERATION OF PARAMETER MAPPING

RELATED APPLICATION

The present application claims the benefit of Provisional Application Control No. 62/245,488, filed on Oct. 23, 2015, the content of which is incorporated herein by reference.

BACKGROUND OF THE INVENTION

Field of the Invention

The present invention generally relates to the field of magnetic resonance imaging, and in particular to the improved ability to use model-based acceleration of parameter mapping (MAP) technique.

Description of the Prior Art

Magnetic Resonance Imaging (MRI), also called magnetic resonance tomography, is a known imaging modality wherein an object to be examined, such as a patient in the case of medical MRI, is placed in a magnetic resonance data acquisition scanner and is exposed therein to a very strong, and homogeneous, basic magnetic field. This causes nuclear spins within the subject to become aligned with the field lines of the basic magnetic field. Radio-frequency (RF) energy, such as in the form of excitation pulses or refocusing pulses, is radiated into the examination subject by an appropriate antenna arrangement of the scanner. The RF energy causes nuclear spins of specific atoms that are resonantly excited by the RF energy to be deflected (flipped) by a defined angle in relation to the field lines of the basic magnetic field. As the excited nuclear spins relax, they emit radio-frequency signals, called magnetic resonance signals, which are received by one or more reception antennas in the scanner. Gradient magnetic fields are superimposed on the basic magnetic field that respectively change in strength along the three axes of a Cartesian coordinate system, so that the received magnetic resonance signals are spatially encoded, so as to allow the respective positions of the nuclear spins from which those signals originate to be determined. The received magnetic resonance signals are entered as complex numerical values into a memory, and thereby form a collection of values known as k-space. The values in k-space can be mathematically transformed, such as by the use of Fourier transformation, into values of pixels in image space, in a procedure known as image reconstruction. The reconstructed image can then be visually presented at a display monitor, or stored as a datafile.

In order to make various types of medical diagnoses, it is often desirable to obtain a time series of magnetic resonance images of the same anatomical region of a patient. Such is the case in the field of cardiac MRI, wherein images of a fixed-position slice, which proceeds through the heart of subject, are obtained. Due to the fact that the heart is beating, slightly different portions of the heart are present in the fixed-position slice at different times within the cardiac cycle, and therefore the series of successive images can be viewed as a movie of the beating heart within that slice. Ideally within each individual image, healthy and diseased (infarcted) tissue will appear with different contrasts, so that tissue damage caused by a myocardial infarction can be evaluated.

Late gadolinium (Gd) enhancement imaging (LGE) is currently the most commonly used and preferred standard for assessing myocardial infarction. This technique is described in "The Use of Contrast-Enhanced Magnetic Resonance Imaging to Identify Reversible Myocardial Dysfunction," Kim et al., New Engl. J. Med. Vol. 343, pp. 1445-1453 (2000): LGE images are typically acquired in a segmented fashion after an inversion recovery (IR) preparation, and the desired contrast, with no signal in the vital myocardial tissue, has to be adjusted manually, by selecting a specific inversion (TI) used in the imaging sequence. If the adjustment of TI is sub-optimal, the differentiation between vital and infarcted tissue is impeded.

Various techniques are known for MR parameter mapping, in which an image or a "map" that shows the distribution of a particular MR parameter is generated. The aforementioned relaxing nuclear spins that form the basis of magnetic resonance imaging exhibit two types of relaxation, called $T_1$ relaxation and $T_2$ relaxation. These different relaxations are commonly used as the relevant parameter in parameter mapping.

A reconstruction technique called Model-based Acceleration of Parameter mapping (MAP) is described in the article "Model-Based Acceleration of Parameter Mapping (MAP) for Saturation Prepared Radially Acquired Data," Tran-Gia et al., Magnetic Resonance in Medicine, Vol. 70, pp. 1524-1534 (2013). This reconstruction technique allows for quantification of the longitudinal relaxation time ($T_1^*$) and proton density from radial single-shot measurements after saturation recovery magnetization preparation. In this procedure, a mono-exponential model in image space is used, and an iterative fitting algorithm is used to reconstruct an image for each of the projections acquired during the saturation recovery relaxation process.

Because this known technique makes use of an exponential signal curve in the model, the use of that technique may be unavailable in imaging, such as cardiac imaging, wherein motion of the anatomy in question is occurring, because there may then not be a suitable exponential signal for which the model is applicable.

SUMMARY OF THE INVENTION

An object of the present invention is to provide a magnetic resonance imaging method and apparatus that allow the aforementioned map technique to be used in conjunction with images in which the anatomy in question is moving, such as in the case of cardiac imaging, for example.

The above object is achieved in accordance with the present invention in a magnetic resonance imaging method and apparatus wherein a forward-backward motion correction (MOCO) is used. Fully sampled 2D images are reconstructed featuring a series of different TI/contrasts from an IR-prepared MR acquisition. This enables the determination of $T_1^*$ maps, and thereby allows the retrospective selection of an optimized image contrast in the case of LGE imaging.

The method and apparatus in accordance with the invention therefore proceed from a number of insights. First, as noted above, the respective contrasts of healthy and diseased cardiac tissue that can be visualized with the conventional LGE procedure are highly dependent on appropriate selection of TI, but conventionally it is possible only to make a best estimate of the appropriate TI at the beginning of an LGE examination. It would be desirable if the selection of TI could be based on actual image data of the type that could be obtained by parameter mapping, and it would be desirable to make use of the advantages of the MAP procedure for such parameter mapping. The MAP procedure, however, is not appropriate for use when the anatomy in question is moving. The present invention therefore combines the MAP procedure with a motion correction algorithm, thereby allowing a parameter map to be obtained even in the context of cardiac motion, and this parameter map can then be used to select the optimum TI for an LGE imaging procedure.

DESCRIPTION OF THE PREFERRED EMBODIMENTS

Figure 1:
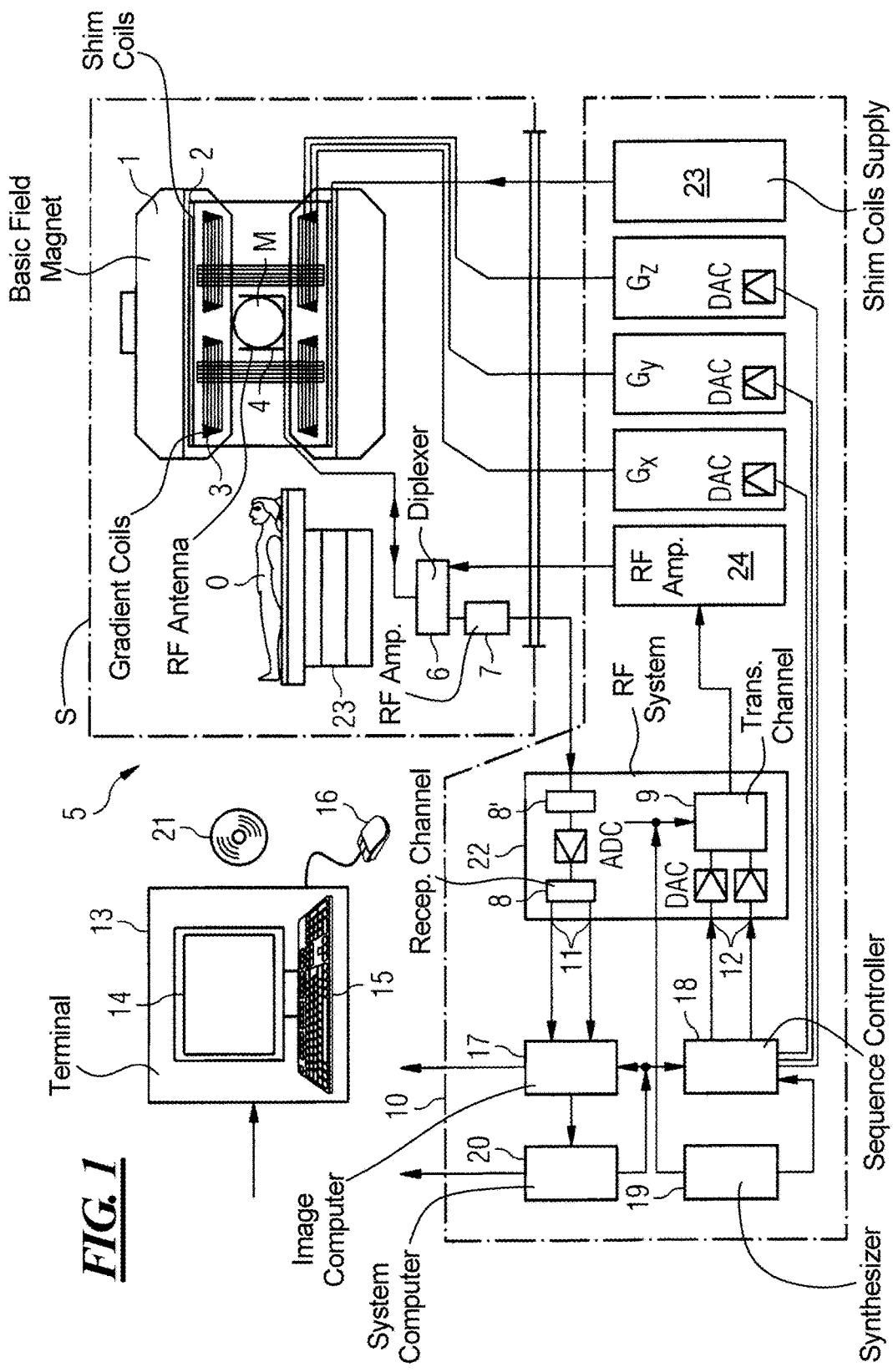
FIG. 1 is a schematic illustration of a magnetic resonance imaging apparatus constructed and operating in accordance with the present invention.

FIG. 1 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 23 for the shim-coils 2.

A cylindrically shaped gradient coil system 3 is incorporated in the basic field magnet 1, composed of three windings. Each winding is supplied by a corresponding amplifier Gx, Gy and Gz, with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier 24 into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

As noted above, details of the MAP procedure can be found in the article by Tran-Gia et al. In summary, the MAP procedure can be divided into steps for data acquisition and steps for reconstruction.

In the MAP data acquisition, one or more magnetization preparations are implemented, and after each preparation a subsequent data acquisition takes place as the excited nuclear spins relax toward equilibrium. The data acquisition is based on gradient echo imaging, with sequences such as FLASH, turboFLASH, trufi(bSSFP), and GRE-EPI. The trajectory along which the acquired data are entered into k-space is not linear Cartesian, and may be radial, or spiral or PROPELLER (BLADE). K-space is undersampled for a single TI value or interval, meaning that not every available data point in k-space is filled in that interval.

The MAP reconstruction is a model-based reconstruction and is typically an iterative reconstruction procedure, meaning that the data acquired and entered into k-space are transformed to image space followed by an application of prior knowledge to the reconstructed image, transformation back to k-space, a check for data consistency, and transformation to image space, etc. The prior knowledge may be a known relaxation behavior in image space, such as mono-exponential relaxation for each individual pixel.

In accordance with the invention, motion correction is incorporated in a MAP procedure in order to render the MAP procedure applicable to the imaging of dynamic processes, such as cardiac motion. In accordance with the invention, image registration for different motion states is implemented using a function for which the inverse function thereof exists, i.e., diffeomorphism. The motion correction information, such as vector fields, can be obtained from a number of sources, such as a different acquisition in conjunction with ECG information, the acquisition at late TI values in conjunction with ECG information, or either a different acquisition or the acquisition of late TI values including motion correction information from early TI values. Examples are the determination of the cardiac phase from early TI values, and the determination of the motion states and the vector field from undersampled images from early TI values.

Figure 2:
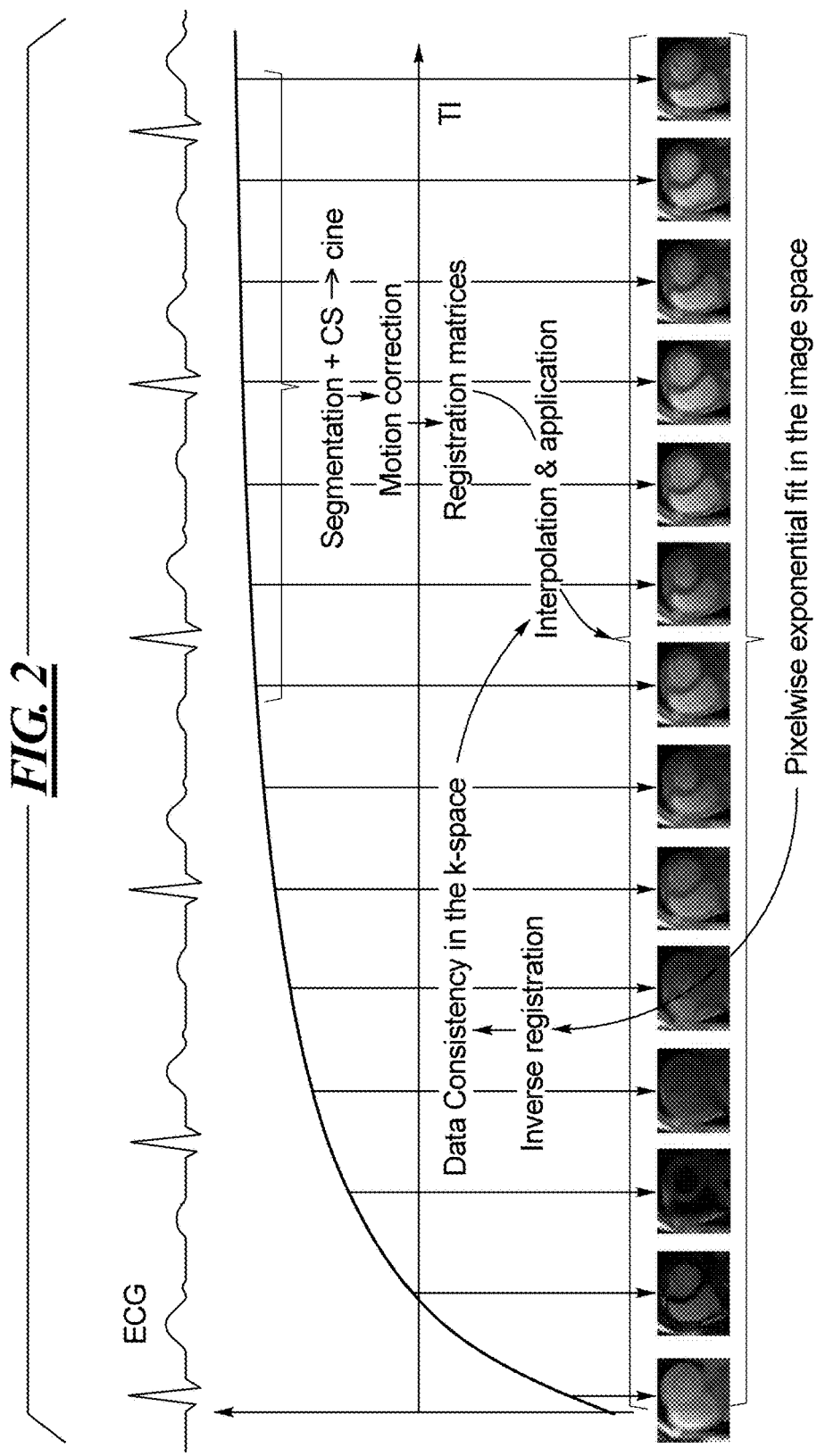
FIG. 2 is a schematic overview of the motion corrected MAP procedure in accordance with the present invention.

The basic features of the motion corrected MAP procedure in accordance with the invention are shown in FIG. 2, wherein a series of cardiac images acquired over time are correlated with the cardiac motion, as represented by the ECG signal. In a first reconstruction step, a compressed sensing algorithm (FISTA) was applied to obtain a fully sampled dynamic cine image series, as shown on the bottom of FIG. 2. To ensure an unchanging contrast, only projections of late TI values were used for this reconstruction. Next, an image registration algorithm was applied to this cine series to determine a transformation from a dynamic to a static series, and vice versa. Finally, the MAP algorithm was adjusted as follows to enable the reconstruction of moving objects. Within each iteration, an image registration step is inserted to "freeze" any motion, before applying the through-time exponential fit of the data. Before ensuring data consistency, this registration was inverted again. In order to stabilize the reconstruction, the consistency of the MAP reconstruction was performed with k-space composed of eight projections. These results are shown in FIGS. 3, 4 and 5.

FIG. 2 shows a short-axis view of a single mid-ventricular slice in the healthy volunteer. The application of the inventive method produces a series of images of high frame rate after an IR preparation, with high temporal and spatial resolution. Undersampling artifacts were almost perfectly removed by the reconstruction. The same image quality was achieved in the long axis view of the heart in the further patient, with right-ventricular infarction as indicated by the arrow in FIG. 5. The series allows for the selection of a frame with optimized contrast for evaluation of potentially infarcted myocardium.

Figure 3:
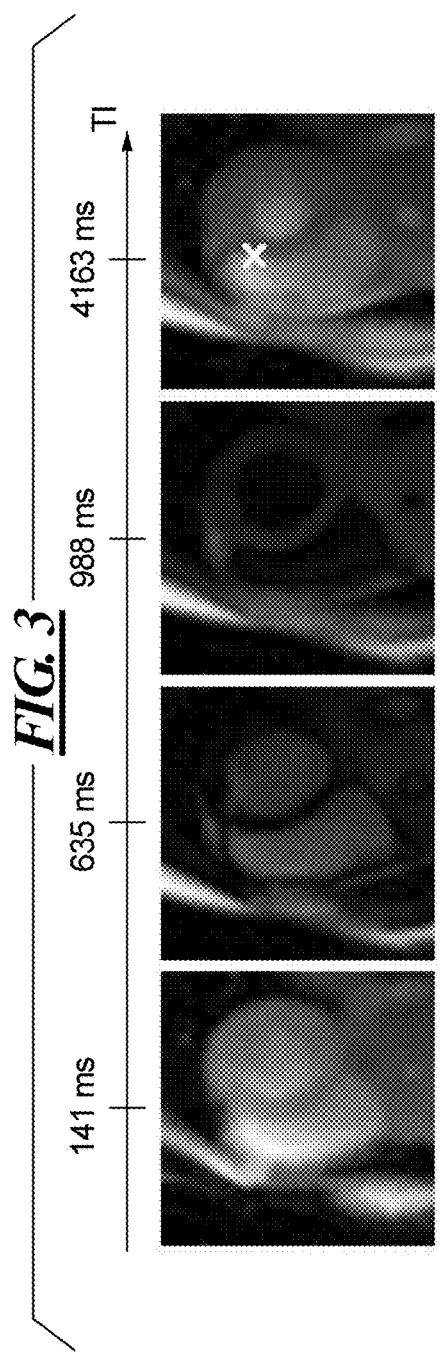
FIG. 3 shows LGE images acquired from a healthy volunteer for exemplary TI values, without the motion corrected MAP procedure in accordance with the present invention.
Figure 4:
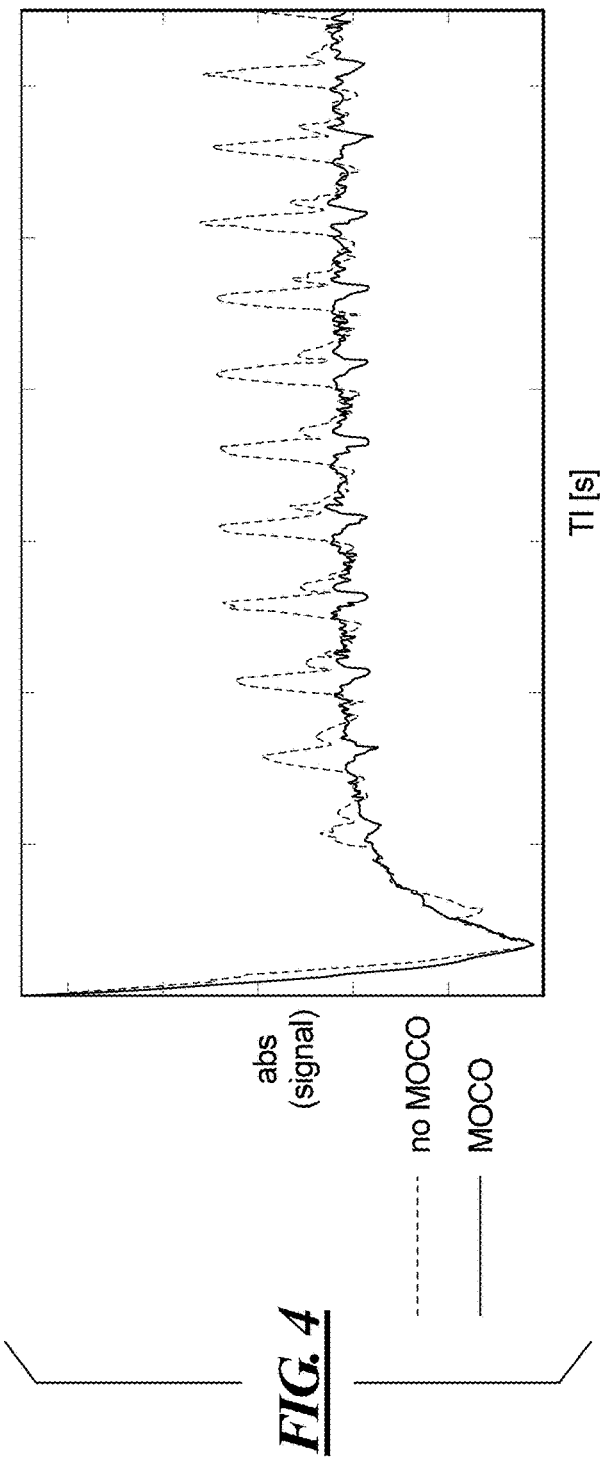
FIG. 4 shows the course of the pixel depicted with the cross in the rightmost image of FIG. 3, with and without motion correction.
Figure 5:
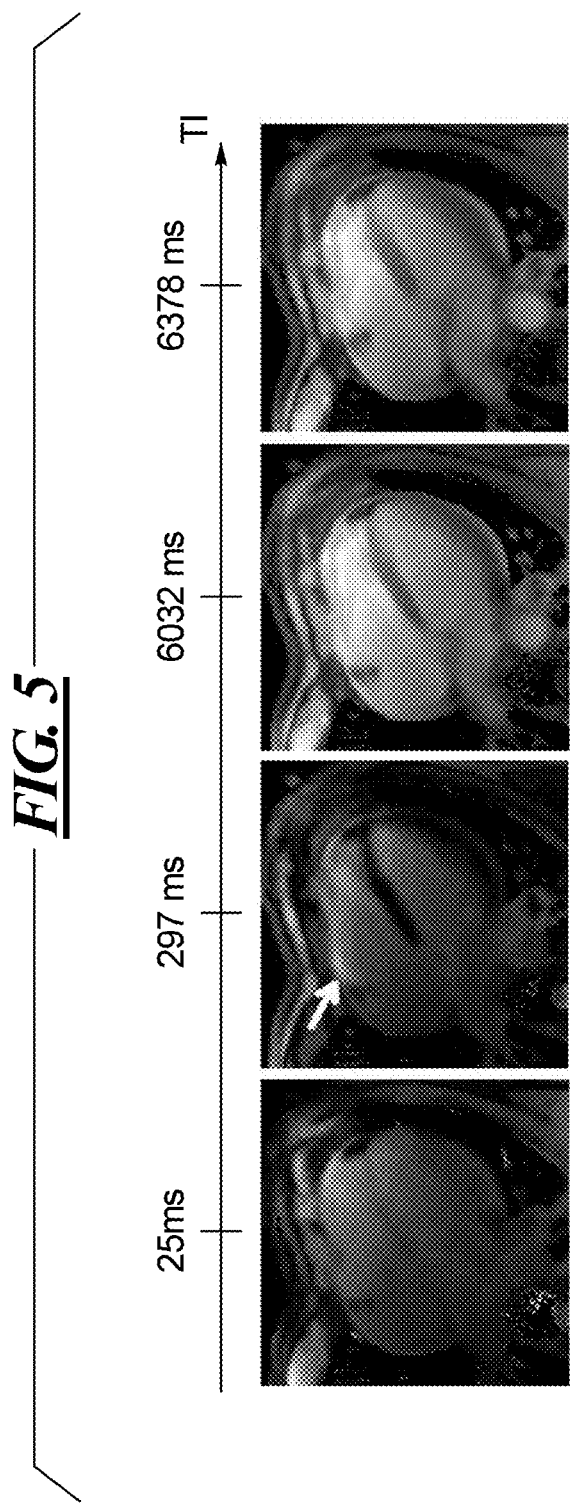
FIG. 5 shows images acquired with the motion corrected MAP procedure in accordance with the invention from a patient with a right-ventricle infarction, as indicated by the arrow in the second image from the left.

FIG. 4 shows the courses of the pixel depicted by the cross in the rightmost image in FIG. 3, with no motion correction (no MOCO), and with motion correction (MOCO) according to the invention. FIG. 3 shows the absolute intensity of the acquired signal, which is pulsatile with no motion correction due to the higher intensity of blood in the ventricles compared to the myocardial tissue successively occurring in the signal. With motion correction, the signal much more closely resembles an exponential signal, thereby making it suitable for use in the MAP procedure.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating magnetic resonance (MR) image data, comprising:
   operating an MR data acquisition scanner to execute an MR data acquisition sequence to acquire an MR signal from a subject, said MR signal being produced by a relaxation of nuclear spins in the subject after excitation of said nuclear spins in said MR data acquisition sequence;
   entering numerical values representing said MR signal into a memory organized as k-space, thereby populating said memory with k-space data;
   providing an image reconstruction computer with a reconstruction algorithm that uses a modeling of said relaxation that requires said MR signal to exhibit a model signal behavior in order to apply said reconstruction algorithm to said MR signal;
   when said MR signal does not exhibit said model signal behavior due to motion of the subject, applying a motion correction procedure to said k-space data to give the MR signal represented by the k-space data said model signal behavior, and thereby obtaining motion-corrected k-space data;
   in said reconstruction computer, applying said reconstruction algorithm, including said modeling of said relaxation, to reconstruct image data from the motion-corrected k-space data; and
   making the image data available from the reconstruction computer in electronic form as a datafile.

2. A method as claimed in claim 1 comprising operating said MR data acquisition scanner to execute a gradient echo imaging sequence as said MR data acquisition sequence.

3. A method as claimed in claim 2 comprising selecting said gradient echo imaging sequence from the group consisting of FLASH, turboFLASH, trufi(bSSFP), and GRE-EPI.

4. A method as claimed in claim 1 comprising:
   operating said MR data acquisition scanner to execute a late gadolinium enhancement imaging sequence as said MR data acquisition sequence;

displaying an image of the subject corresponding to said image data at a display monitor in communication with said reconstruction computer; and from the displayed image, selecting a parameter for the contrast of said late gadolinium enhancement procedure.

5. A method as claimed in claim 1 comprising:

populating said memory with k-space data along a radial trajectory in said memory; and using a Model Based Acceleration of Parameter Mapping Algorithm as said reconstruction algorithm that requires said MR signal to exhibit said model signal behavior.

6. A method as claimed in claim 1 comprising:

operating said MR data acquisition scanner to execute a late gadolinium enhancement sequence as said MR data acquisition sequence;

populating said memory with k-space data along a radial trajectory in said memory;

using a Model Based Acceleration of Parameter Mapping Algorithm as said reconstruction algorithm that requires said MR signal to exhibit said model signal behavior displaying an image data of the subject corresponding to said image data at a display monitor in communication with said reconstruction computer; and from the displayed image, selecting a parameter for execution of said late gadolinium enhancement sequence.

7. A magnetic resonance (MR) apparatus comprising:

an MR data acquisition scanner;

a control computer configured to operate the MR data acquisition scanner to execute an MR data acquisition sequence to acquire an MR signal from a subject, said MR signal being produced by a relaxation of nuclear spins in the subject after excitation of said nuclear spins in said MR data acquisition sequence;

a memory accessible by said control computer;

said control computer being configured to enter numerical values representing said MR signal into a memory organized as k-space, thereby populating said memory with k-space data;

an image reconstruction computer provided with a reconstruction algorithm that uses a modeling of said relaxation that requires said MR signal to exhibit a model signal behavior in order to apply said reconstruction algorithm to said MR signal;

when said MR signal does not exhibit said model signal behavior due to motion of the subject, said image reconstruction computer being configured to apply a motion correction procedure to said k-space data to give the MR signal represented by the k-space data said model signal behavior, to thereby obtain motion-corrected k-space data;

said reconstruction computer being configured to apply said reconstruction algorithm, including said modeling of said relaxation, to reconstruct image data from the motion-corrected k-space data; and said reconstruction computer being configured to make the image data available from the reconstruction computer in electronic form as a datafile.

8. An apparatus as claimed in claim 7 wherein said control computer is configured to operate said MR data acquisition scanner to execute a gradient echo imaging sequence as said MR data acquisition sequence.

9. An apparatus as claimed in claim 8 wherein said control computer is configured to operate said MR data acquisition scanner by selecting said gradient echo imaging sequence from the group consisting of FLASH, turboFLASH, trufi (bSSFP), and GRE-EPI.

10. An apparatus as claimed in claim 7 comprising:

said control computer being configured to operate said MR data acquisition scanner to execute a late gadolinium enhancement imaging sequence as said MR data acquisition sequence;

a display monitor in communication with said image reconstruction computer, said image reconstruction computer being configured to display an image of the subject corresponding to said image data at a display monitor in communication with said reconstruction computer; and said control computer being configured to receive a parameter for execution of said late gadolinium enhancement procedure selected from said displayed image.

11. An apparatus as claimed in claim 7 wherein said control computer is configured to populate said memory with k-space data along a radial trajectory in said memory, and wherein said image reconstruction computer is configured to use a Model Based Acceleration of Parameter Mapping Algorithm as said reconstruction algorithm that requires said MR signal to exhibit said model signal behavior.

12. An apparatus as claimed in claim 7 comprising:

said control computer being configured to operate said MR data acquisition scanner to execute a late gadolinium enhancement sequence as said MR data acquisition sequence;

wherein said control computer is configured to populate said memory with k-space data along a radial trajectory in said memory;

wherein said image reconstruction computer is configured to use a Model Based Acceleration of Parameter Mapping Algorithm as said reconstruction algorithm that requires said MR signal to exhibit said model signal behavior;

a display monitor in communication with said image reconstruction computer, said image reconstruction computer being configured to display an image data of the subject corresponding to said image data at a display monitor in communication with said reconstruction computer; and said control computer being configured to receive a parameter for execution of said late gadolinium enhancement sequence selected from said displayed image.

* * * * *